(12) United States Patent
Hovel

(10) Patent No.: US 8,101,856 B2
(45) Date of Patent: Jan. 24, 2012

(54) QUANTUM WELL GAP/SI TANDEM PHOTOVOLTAIC CELLS

(75) Inventor: Harold J. Hovel, Katonah, NY (US)

(73) Assignee: International Business Machines Corporation, Armonk, NY (US)

(*) Notice: Subject to any disclaimer, the term of this patent is extended or adjusted under 35 U.S.C. 154(b) by 148 days.

(21) Appl. No.: 12/243,995

(22) Filed: Oct. 2, 2008

(65) Prior Publication Data

US 2010/0083997 A1     Apr. 8, 2010

(51) Int. Cl.
*H01L 31/032* (2006.01)
(52) U.S. Cl. .......... 136/261; 136/262; 136/252; 438/93; 438/74
(58) Field of Classification Search .......... 136/252–265; 438/57
See application file for complete search history.

(56) References Cited

U.S. PATENT DOCUMENTS

| | | | |
|---|---|---|---|
| 4,100,825 A | 7/1978 | McConnell | |
| 4,295,002 A | 10/1981 | Chappell et al. | |
| 4,387,265 A | 6/1983 | Dalal | |
| 4,582,952 A | 4/1986 | McNeely | |
| 4,631,352 A | 12/1986 | Daud | |
| 4,688,068 A * | 8/1987 | Chaffin et al. | 136/249 |
| 4,914,044 A | 4/1990 | Grabmaier | |
| 4,933,022 A | 6/1990 | Swanson | |
| 5,569,332 A | 10/1996 | Glatfelter | |
| 5,897,715 A | 4/1999 | Ward | |
| 5,917,201 A * | 6/1999 | Ming-Jiunn et al. | 257/94 |
| 6,441,297 B1 | 8/2002 | Keller | |
| 6,815,736 B2 | 11/2004 | Mascarenhas | |
| 7,148,417 B1 * | 12/2006 | Landis | 136/262 |
| 2005/0172997 A1 | 8/2005 | Meier | |
| 2006/0112986 A1 | 6/2006 | Atwater | |
| 2006/0272700 A1 * | 12/2006 | Young et al. | 136/256 |
| 2007/0186970 A1 * | 8/2007 | Takahashi et al. | 136/255 |
| 2008/0173350 A1 * | 7/2008 | Choi et al. | 136/258 |
| 2009/0020154 A1 * | 1/2009 | Sheng et al. | 136/255 |
| 2009/0269913 A1 * | 10/2009 | Terry et al. | 438/558 |

OTHER PUBLICATIONS

Anderson, Neal G., On Quantum Well Solar Cell Efficiencies, University of Massachusetts, Physica E, vol. 14, pp. 126-131, 2002.*
Kunert et al., Direct Band Gap (Ga(NAsP) Material System Pseudomorphically grown on GaP Substrate, Applied Physics Letters, vol. 88, pp. 182108-1 to 182108-3, 2006.*
Li, Sheng S., Semiconductor Physical Electronics, Light Emitting Devices, Chapter 13, pp. 1-55, 2006.*

(Continued)

*Primary Examiner* — Jennifer Michener
*Assistant Examiner* — Jayne Mershon
(74) *Attorney, Agent, or Firm* — Graham S. Jones, II; Louis J. Percello; Robert M. Trepp

(57) ABSTRACT

Two junction solar energy conversion devices, i.e. photovoltaic cells have a bottom silicon N+/P/P+ photovoltaic cell and an upper GaP N+/P/P+ photovoltaic cell containing quantum well layers which extend the wavelength range over which the GaP cell absorbs light. The quantum well layers are composed of materials other than Gallium Phosphide (GaP) and may be either pseudomorphic or metamorphic. Light trapping may be incorporated at the top surface of the GaP photovoltaic cell along with anti-reflective coatings, and light trapping may be incorporated on the bottom surface of the silicon cell. The bottom surface of the silicon photovoltaic cell is coated with a passivating dielectric layer and electrical contact to the silicon is made with conductive vias extending through the passivating layer.

17 Claims, 2 Drawing Sheets

OTHER PUBLICATIONS

G.H. Negley, J.B. McNeely, P.G. Lasswell, E.A. Gartley, A.M. Barnett, T.M. Trumble, "Design and development of GaAsP on GaP/sil;icon mechanically stacked, multijunction solar cells", Conference Record of the Nineteenth IEEE Photovoltaic Specialists Conference—1987 (Cat. No. 87CH2400-0), p. 119-123. Published by IEEE, Conference location: New Orleans, LA.

* cited by examiner

QUANTUM WELL GAP/SI TANDEM PHOTOVOLTAIC CELLS

CROSS-REFERENCE TO RELATED APPLICATIONS

This application contains subject matter which is related to the subject matter of the following commonly assigned copending applications, including U.S. patent application Ser. No. 12/242,962 filed on Oct. 1, 2008 entitled "Optical Tandem Photovoltaic Cell Panels"; and U.S. patent application Ser. No. 12/246,511, filed on Oct. 7, 2008 entitled "Tandem Nanofilm Photovoltaic Cells Joined By Wafer Bonding". Each of the above listed applications is hereby incorporated herein by reference in its entirety.

BACKGROUND OF THE INVENTION

This invention relates to photovoltaic energy conversion devices, commonly known as photovoltaic cells and more particularly to two junction solar cells.

Multijunction photovoltaic cells, which consist of two or more junctions of two or more materials, result in higher efficiency of converting sunlight to electricity because they make better use of the solar spectrum compared to single junction photovoltaic cells. Research and development of multijunction cells has been carried out for a number of years and has resulted in a number of scientific publications and patents.

SUMMARY OF THE INVENTION

Definitions

Electromagnetic Radiation to Electric Energy Conversion Device (EREECD): A device that reacts with electromagnetic (optical) radiation to produce electrical energy Optical Radiation to Electric Energy Conversion Device (OREECD): A device that reacts with optical electromagnetic radiation to produce electrical energy. Such a device could be a radiation absorbing device, e.g. a photodetector/counter, photovoltaic cell (solar cell) or a radiation-driven electrolysis cell.

Optoelectronic Energy Device (OED): A device that reacts with optical radiation to produce electrical energy with an electronic device Photovoltaic cell: An electrical device (e.g. a semiconductor) that converts light or other radiant energy, in the range from ultraviolet to infrared radiation, incident on its surface into electrical energy in the form of power/voltage/current which has two electrodes, usually a diode with a top electrode and a bottom electrode with opposite electrical polarities. The photovoltaic cell produces direct current which flows through the electrodes. As employed herein, the term photovoltaic cell is generic to cells which convert radiant energy into electrical energy including EREECDs, OREECDs, and OEDs as defined above. A solar cell is a photocell that converts light including solar radiation incident on its surface into electrical energy.

Stack: A cascade of photovoltaic cells with one cell mounted on top of another so that sunlight is incident on the one upper cell and some or all filters down to the underlying cell.

Solar spectrum: The amount of solar energy available as a function of the wavelength of the incident photons. The energy of each photon is 1.24 volts divided by the wavelength in microns.

Spectral response: The electrical current produced by a photovoltaic cell at the wavelength of an incident photon.

Current matching: The electrical condition in which each photovoltaic cell in a multifunction stack contributes the same photocurrent when illuminated by sunlight.

Critical thickness: The thickness of a layer of material, deposited on a different underlying material with different lattice spacing, below which the deposited layer will adopt the lattice spacing of the underlying material with few or no defects being formed.

Electrically parallel: The connection of the top electrodes and bottom electrodes of two or more photovoltaic cells with the top electrodes and bottom electrodes of other photovoltaic cells such that the currents produced by the photovoltaic cells add together.

Electrically series: The connection of the top electrode of one photovoltaic cell to the bottom electrode of another such that the voltages produced by the cells add together.

Optically series: An arrangement wherein light incident on a device is partly absorbed in that device and the remainder is passed down to another device.

Tandem: Another term for a stack of photovoltaic cells where some incident light is absorbed by higher-lying cells and the portion not absorbed is passed down to lower-lying cells.

Bandgap or energy bandgap: The characteristic energy profile of a semiconductor that determines its electrical performance, current and voltage output, which specifically is the difference between the valence band and conduction band of the semiconductor.

N/P junction: A connection between a p-type semiconductor and an n-type semiconductor which produces a diode.

Depletion region: A transition region between an n-type region and a p-type region of an N/P junction where a high electric field exists.

Tunnel junction: A p/n junction doped so highly that it exhibits ohmic electrical behavior rather than diode-like behavior.

Contact grids: A collection of metal lines connected together so they gather current generated by a photovoltaic cell with low electrical resistance, while allowing incident sunlight to reach most of the semiconductor surface.

Pseudomorphic: The condition between two materials connected together such that a first material adopts the lattice spacing of a second material.

Metamorphic: The condition existing between two materials connected together in which each material exhibits its own normal lattice spacing.

Load: A power-using device that requires power to be supplied to it such as an appliance, heater, television, etc.

Base: The base of a photovoltaic cell is the main body lying below the junction boundary.

Multijunction: A group of two or more photovoltaic cells operating together to form an energy conversion device.

Tandem photovoltaic cells are photovoltaic energy conversion devices incorporating at least two independent photovoltaic cells made from different materials with different bandgaps so that a fraction of the solar spectrum is absorbed in each cell. The overall efficiency of converting incident solar energy is enhanced since each material is a better match to the fraction of the solar spectrum which it absorbs, boosting the efficiency from a 28% maximum for a single junction cell to 40% for two junctions, and even higher for more junctions. Some tandem cells are arranged so that each cell has its own separate load, making them three or four terminal devices. It is technically and economically better to make the cell a two terminal device in series connection with only one load, but this puts more stringent requirements on making the photocurrents substantially identical for each cell (current matching requirement).

The choice of material bandgaps to optimize efficiency of a two junction tandem photovoltaic cell is guided by the solar spectrum (amount of power contained in each wavelength range) and the absorption properties of the materials. Silicon (Si) is a very desirable material for the bottom cell, as it is a highly abundant material with a highly developed and technically perfected photovoltaic cell technology behind it.

For two junctions devices, optimum combinations which include a bottom cell of Si (1.1 eV bandgap) suggest a top cell with about a 1.7-1.8 eV bandgap, such as GaAsP or GaInP. The Si voltage output is typically 0.6 volt during operation while that of the upper cell is around 1.1 volt. The choice of a top cell bandgap of 1.7-1.8 eV is determined by the need to match photocurrents. Higher bandgap materials such as GaP are more desirable due to a larger voltage output, but absorb less of the solar spectrum and violate the current matching requirement.

If a way can be devised to extend the GaP absorption to increase its photocurrent while still obtaining the advantage of the higher voltage output, the current matching can be reinstated and the efficiency improved over other two junction combinations. This invention provides a way to enhance the GaP absorption as required in a tandem cell with advanced features such as light trapping and back side reflection. Quantum wells are created by sandwiching thin layers of a semiconductor material between regions of a higher bandgap materials. Light with a photon energy less than the higher bandgap, which would normally pass through the higher bandgap material, is absorbed by the lower bandgap quantum well material imbedded within the higher bandgap material.

The best performance is attained by imbedding the quantum well material within the depletion region of the N/P junction of the higher bandgap material, so photocarriers (hole and electron pairs) created by absorbing light are collected efficiently by being separated and swept from the depletion region by the high electric field of the junction. Performance enhancement is attained, even if the quantum well material is thick (several times 1,000 Å) or composed of alternating regions of the quantum well material and high bandgap material, as long as all the quantum well material is contained within the depletion region of the junction.

Each photovoltaic cell of a tandem stack of photovoltaic cells can be optimized separately using the best designs and processing procedures developed for the various materials. For example, tandem Si photovoltaic cells are enhanced by incorporating the back surface thereof with a diffused region and a passivating dielectric layer such as silicon dioxide ($SiO_2$) to minimize surface recombination. The top (front) surface of a tandem photovoltaic cell also benefits from a passivating layer. GaP with its close lattice match to the lattice match of Si serves as a passivating layer. The present invention provides a GaP cell stacked upon a Si cell thereby including the best design features for Si cells of an N+/P/P+ structure with a passivating back surface and front surface passivation provided by the GaP material. Contact to the rear surface of the tandem cell is made by etching holes (vias) through the passivating dielectric to expose the rear surface of the P+ Si, followed by deposition of the metal over the at least some of the back surface. The backside metal has the additional benefit of reflecting any of the solar photons not absorbed by either layer of the tandem stack back into the semiconductors for further probability of absorption and photocurrent creation.

The upper GaP material also contains N+/P/P+ configuration. It can be created, for example, by epitaxial growth of a first P region with high p-type dopant densities to create a P+ region, followed by a lightly-doped p-type region, and an n-type region doped with a high density of n-type dopant. In between the growth of the lightly doped p-type region and N+ region, additional lower bandgap material can be incorporated to create the quantum wells. For example, the addition of As to the gas mixture results in a region of GaAsP and the addition of indium (In) results in the creation of GaInP, while replacing the P entirely with As results in GaAs regions and adding In and As results in GaInAs or GaInAsP. All these materials have lower bandgaps than GaP and enhance the absorption of lower energy sunlight. Multiple alternating layers of GaAsP and GaP, or GaInP and GaP, or GaAs and GaP can be grown by adjusting the gas mixtures during the process of epitaxial growth of layers of materials. By incorporating these materials in subsequent layers after formation of the lightly p-type GaP layer and before the N+ GaP layer, the layers are automatically within the depletion region that will result from the N+/P GaP junction.

Quantum wells might consist of three or more alternating layers of lower bandgap material sandwiched between GaP regions. Each layer of lower bandgap material might be, for example, 100 Å thick. For best sunlight absorption, the composition of the lower bandgap material should bring it into the "direct bandgap" range of compositions where absorption is highest. The sum total of thickness of the lower bandgap materials making up the quantum well may be up to several times 1,000 Å or higher; for example, with as many as ten layers with each being 200 Å thick each or twenty layers with each being 100 Å thick. Normally each quantum well layer in a quantum well structure has a thickness of 100 Å or less. However, in the GaP photovoltaic cell, the lower bandgap layers inside the depletion region could be thicker, several times 100 Å to as much as 1,000 Å, while still resulting in enhanced absorption, as long as they remain contained within the depletion region.

If the lattice constants of the different materials constituting the quantum well region are closely matched, then few if any defects are formed. Alternately, quantum well materials with non-matching lattice spacings can still be pseudomorphic with low defect densities if the layer thicknesses are below the critical thickness for defect formation, typically on the order of 100 Å to 200 Å.

A possible extra benefit of growth of GaP on the Si photovoltaic cell is the diffusion of phosphorus into the surface of the Si to create the N+ layer, eliminating several process steps and reducing manufacturing cost. An alternative to epitaxial growth of GaP on a Si photovoltaic cell is to create a tandem structure by separate growth of an optimized GaP cell containing the desired quantum well layers on a GaP substrate followed by wafer bonding of the GaP onto the Si cell by means well known in the art. The fabrication of multifunction cells by fabricating and optimizing each cell separately and putting them together into the stack by wafer bonding is a very promising method for creating tandem cells since it eliminates the problems of growing different materials onto each other.

The region consisting of the back side P+ region of the GaP and the N+ surface of the Si junction also serves as a tunnel junction. This provides the valuable benefit of acting as a low resistance interconnection between the two photovoltaic cells while not blocking any of the light passing from the GaP cell into the Si cell.

In addition to the reflection of un-absorbed sunlight that reaches the bottom surface and is reflected back up into the semiconductor for a second "pass," the top surface can be textured to cause sunlight to reflect downward into the tandem photovoltaic cell instead of being reflected upward and therefore lost. This is commonly done by etching the surface with a base such as KOH (potassium hydroxide) or by plasma etching. By creating a rough surface with surface angles of 45 degrees or greater, light is reflected into the material instead of away from it. Similarly, the bottom surface can be roughened to create reflection at higher angles for longer light paths and therefore higher probability of absorption. While "light trapping," involving multiple passes of light through the material, is not very significant for thick semiconductors where most light is absorbed in the first pass, it is increasingly important as the materials are made thinner, which has cost-reducing benefits.

While Mascarenhas U.S. Pat. No. 6,815,736 describes a device which contains regions of doped GaP which they term quantum wells, since they are made of GaP, they are not quantum wells as known in the art which are layers of alternate, different materials.

It is an object of this invention to provide a multijunction, two terminal, interconnected tandem photovoltaic cell formed with a top GaP cell above a bottom Si cell while including quantum wells within the GaP, interdigitated back contacts including conductive vias extending through a passivating dielectric layer on the back surface, incorporating a tunnel junction of P+ GaP to N+ Si, and texturing of the top and bottom surfaces of the photovoltaic cell device for light trapping at both surfaces, and back side reflection.

In accordance with this invention, a two junction tandem photovoltaic cell device includes a bottom, Si photovoltaic cell comprising a first N+ region, a first P-type region and a first P+ region and an upper, GaP photovoltaic cell comprising a second N+ region, a second P-type region, and a second P+ region device. A depletion region is formed by a N+ GaP junction of the second N+ type region and the second P-type Gap region of the GaP photovoltaic cell. The GaP photovoltaic cell incorporates at least one layer of a material within the depletion region of the N+ GaP junction. There is a tunnel junction interconnection between the GaP region and the Si cell, and electrical means of contacting the upper GaP photovoltaic cell and the bottom Si photovoltaic cell.

Preferably, at least one layer within the depletion region of the GaP photovoltaic cell constitutes a quantum well region; and the Si cell has a back surface covered with a passivating layer; and with conductor filled vias formed through the passivating layer providing electrical contact to the first P+ region of the Si photovoltaic cell. Preferably, the light trapping means are formed above the GaP photovoltaic cell and below the Si photovoltaic cell; and the at least one layer of material within the depletion region consists of at least one material selected from the group consisting of GaAs, GaAsP, GaInAs, GaInP, and GaInAsP.

In accordance with another aspect of this invention, a two junction tandem photovoltaic cell device comprising an N+/P/P+, bottom, Si photovoltaic cell, an N+/P/P+, upper, GaP photovoltaic cell with a GaP junction, incorporating at least one layer of a material within a depletion region of the GaP junction a tunnel junction interconnection between the GaP photovoltaic cell and the Si photovoltaic cell. A passivating layer is provided on a back side of the Si cell; and electrical means contact the GaP photovoltaic cell and the Si photovoltaic cell. The layers within the depletion region of the GaP junction constitute a quantum well region. The quantum well region is created using materials from the list of GaAs, GaAsP, GaInAs, GaInP, and GaInAsP. The light trapping means are formed on a top surface of the GaP cell and on a bottom surface of the Si cell. The materials constituting the quantum well region are pseudomorphic with GaP.

In accordance with yet another aspect of this invention, a two junction tandem photovoltaic cell device comprising a N+/P/P+ bottom, Si photovoltaic cell and a N+/P/P+ upper, GaP photovoltaic cell incorporates at least one layer of a material within a depletion region of a GaP junction of the GaP photovoltaic cell. A tunnel junction interconnection is provided between the GaP photovoltaic cell and the Si photovoltaic cell. A passivating layer is formed on a back surface of the Si cell. A light trapping means is formed on at least one of a top surface of the GaP photovoltaic cell and a bottom surface of the Si photovoltaic cell. Electrical means contact the GaP photovoltaic cell and the Si photovoltaic cell.

The depletion region of the GaP photovoltaic cell contains a quantum well. The layers within the depletion region of the GaP photovoltaic cell comprises a quantum well consisting of at least one material selected from the group consisting of GaAs, GaAsP, GaInAs, GaInP, and GaInAsP. The layers within the depletion region of the GaP photovoltaic cell are pseudomorphic. The at least one layer within the depletion region of the GaP photovoltaic cell is pseudomorphic. The electrical means of contacting the GaP photovoltaic cell and the Si photovoltaic cell comprise an upper grid and a lower grid. The electrical means is in contact with a metal layer formed on a bottom surface of the passivation layer. The light trapping means includes textured front and back surfaces.

In accordance with this invention, solar energy conversion devices, i.e. photovoltaic cells, are provided which comprise two junction photovoltaic cells having a bottom Si N+/P/P+ photovoltaic cell and an upper GaP N+/P/P+ photovoltaic cell containing quantum well layers which extend the wavelength range over which the GaP cell absorbs light. One or more of the quantum well layers are composed of materials other than Gallium Phosphide (GaP) and may be either pseudomorphic or metamorphic.

Light trapping may be incorporated at the top surface of the GaP photovoltaic cell along with anti-reflective coatings, and light trapping may be incorporated on the bottom surface of the Si cell. The bottom surface of the Si cell is coated with a passivating dielectric layer through which vias have been etched. Electrical contact to the Si is made by filling the conductive vias with electrical conductors.

The invention and objects and features thereof will be more readily apparent from the following detailed description and appended claims when taken with the drawings.

The detailed description which follows explains the preferred embodiments of the invention, together with advantages and features thereof with reference to the accompanying drawings.

DETAILED DESCRIPTION OF PREFERRED EMBODIMENTS OF THE INVENTION

Figure 1:
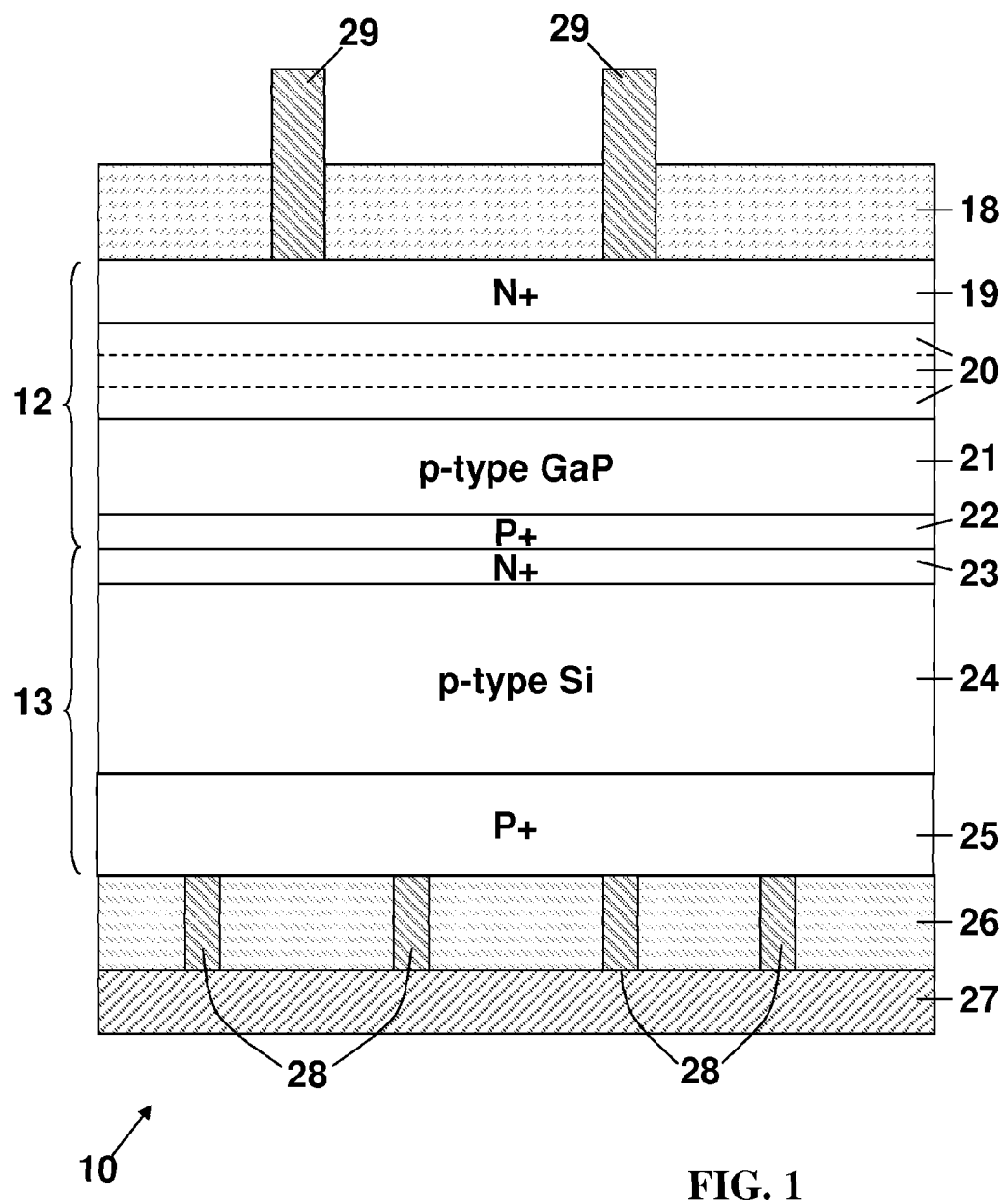
FIG. 1 shows a GaP/Si tandem photovoltaic cell including quantum wells, passivated back surface, interdigitated back contact, and GaP/Si tunnel junction interconnect.

FIG. 1 shows a GaP/Si tandem photovoltaic cell device 10 including quantum wells, a passivated back surface, an interdigitated back contact, and a GaP/Si tunnel junction interconnect consisting of an upper, GaP photovoltaic cell 12 formed above a lower, silicon photovoltaic cell 13.

The upper, GaP photovoltaic cell 12 consists of an N+ doped upper region 19, a lightly-doped p-type GaP intermediate region 21, and a P+ doped lower region 22; and a quantum well region 20 consisting of one or more quantum well epitaxial, pseudomorphic, quantum well layers 20, which are located between the N+ doped upper region 19 thereabove and the lightly-doped p-type GaP intermediate region 21 therebelow.

The lower silicon photovoltaic cell 13 consists of an N+ doped upper region 23, a lightly-doped p-type Si intermediate region 24, a P+ doped lower region 25.

The P+ doped lower region 25 resides above the top surface of a dielectric, passivating layer 26 which comprises the back surface of the tandem photovoltaic cell device 10. Vias are etched through the dielectric, passivating layer 26 that extend down from the top to the bottom thereof to expose the back surface of P+ layer 25, and the vias are then filled from the top to the bottom thereof with electrically conductive, metal contacts 28, which extend through the dielectric, passivating layer 26 from the top to the bottom thereof. The metal contacts 28 are in electrical and mechanical contact with the bottom surface of the P+ doped lower region 25 of the lower silicon photovoltaic cell 13.

A metal layer 27 formed on the bottom surface of the dielectric, passivating layer 26, which is electrically conductive is in electrical and mechanical contact with the metal contacts 28. Thus the metal layer 27 provides electrical connections to the bottom surface of the P+ doped lower region 25 of the lower silicon photovoltaic cell 13 through the metal contacts 28. Thus, electrical contact can be made to the P+ doped lower region 25 through the metal layer and the contacts 28.

The dielectric, passivating layer 26 may typically be composed of silicon dioxide ($SiO_2$) or silicon nitride ($Si_3N_4$), but any other material with surface passivating properties may be employed instead, such as amorphous silicon. Metal contact 27 may cover the entire rear surface of the tandem photovoltaic cell device 10, which results in the reflection of any light not absorbed after passing through the upper and lower photovoltaic cells 12 and 13 back upward into the photovoltaic cells 12 and 13.

Referring to the upper, GaP photovoltaic cell 12, FIG. 1 shows a metal electrical grid 29 which contacts the N+ GaP region 19 through vias which were etched through the anti-reflective (AR) coating layer 18 down to the top surface of the N+ doped region 19, followed by filling those vias with metal, as will be well understood by those skilled in the art. Alternately, the metal of the metal electrical grid 29 can be deposited onto the N+ GaP region 19 prior to deposition of the AR coating layer 18. A lightly-doped p-type GaP region 21 has a back surface 22 of P+ GaP.

FIG. 1 shows that the quantum well region 20 comprises three pseudomorphic, quantum well epitaxial layers 20 in the upper photovoltaic cell 12, which consist partly of materials with bandgaps less than that of GaP. Those quantum well epitaxial layers 20 are shown sandwiched between N+ GaP layer 19 and p-type GaP layer 21 and therefore reside in the depletion region of the GaP n/p junction of the upper photovoltaic cell 12. The quantum well epitaxial layers 20, which will exhibit low defect densities if the material used therein has the same lattice constant as GaP, are pseudomorphic and adopt the same lattice constant as the GaP if they are thin, below or comparable to the critical thickness for compatibility with the lightly-doped p-type GaP intermediate region 21.

The critical thickness depends on the difference in lattice spacing between GaP and the quantum well materials and is typically 100 Å to 200 Å. The closer the lattice spacings between the two materials, the larger is the critical thickness.

The lower P+ layer 22 of the upper GaP photovoltaic cell 12 and upper N+ Si layer 23 of the bottom Si photovoltaic cell 13 form a tunnel junction which interconnects the upper photovoltaic cell 12 to the lower photovoltaic cell 13.

Figure 2:
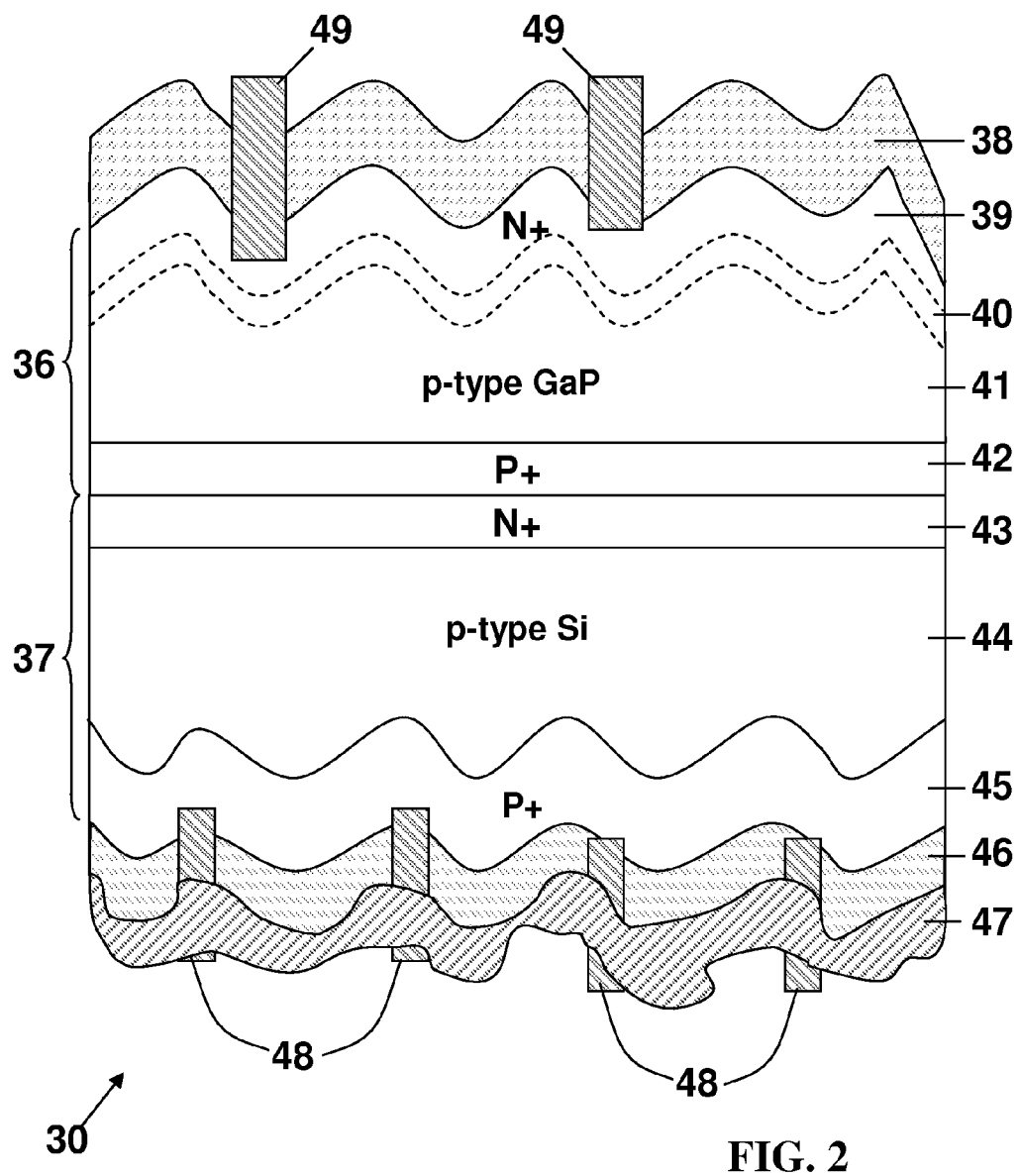
FIG. 2 shows a tandem GaP/Si tandem photovoltaic cell including quantum wells, a passivated back surface, an interdigitated back contact structure, and a GaP/Si tunnel junction interconnect with front and back surfaces textured for light trapping consisting of an upper GaP photovoltaic cell formed above a bottom Si photovoltaic cell.

FIG. 2 shows a tandem GaP/Si tandem photovoltaic cell device 30 including quantum wells, a passivated back surface, an interdigitated back contact structure, and a GaP/Si tunnel junction interconnect with front and back surfaces textured for light trapping. The tandem photovoltaic cell consist of an upper GaP photovoltaic cell 36 formed above a bottom Si photovoltaic cell 37.

The upper GaP photovoltaic cell 36 consists of an upper N+ layer 39, an intermediate p-layer 41, and a lower P+ layer 42, with one or more quantum well region 40 consisting of one or more pseudomorphic, quantum well, epitaxial layers 40 located between the N+ doped upper region 39 thereabove and the lightly-doped p-type GaP intermediate region 41 therebelow.

The bottom Si photovoltaic cell 37 consists of an upper N+ layer 43, an intermediate p-layer 44, and a lower, P+ doped layer 45.

The lower P+ layer 42 of the upper GaP photovoltaic cell 36 and the upper N+ Si layer 43 of the bottom Si photovoltaic cell 37 form a tunnel junction which interconnects the upper photovoltaic cell 36 to the lower photovoltaic cell 37.

A dielectric, passivating layer 46 is formed on the bottom surface of the lower P+ layer 45 of the bottom Si photovoltaic cell 37. Vias are etched that extend through the passivating layer 46 down from the top to the bottom thereof to expose the back surface of P+ layer 45, and the vias are then filled, from the top to the bottom with electrically conductive, metal contacts 48, which extend through the passivating layer 46 from the top to the bottom thereof. The metal contacts 48 are in electrical and mechanical contact with the bottom surface of the lower, P+ doped layer 45 of the lower silicon photovoltaic cell 37. A metal layer 47, which is formed on the bottom surface of the dielectric, passivating layer 46, is electrically conductive and is in electrical and mechanical contact with the metal contacts 48. The metal layer 47 provides electrical connections to the bottom surface of the P+ doped lower region 45 of the lower silicon photovoltaic cell 37 by its connections to the contacts 48. Thus, electrical contact can be made to the P+ doped layer 45 through the metal layer and the contacts 48.

Referring to the upper, GaP photovoltaic cell 36, metal grid contacts 49 are made to the N+ GaP layer 39 through vias extending from the top to the bottom of the AR coating layer 38. The lightly doped p-type GaP region 41 is covered on the back/lower surface by the P+ GaP layer 42. As stated above, the quantum well region 40 (consisting of one or more layers of pseudomorphic, quantum well, epitaxial layers 40 of material with a bandgap less than that of GaP) is sandwiched between N+ GaP layer 39 and p-type region 41. If the quantum well layers are thin, below or comparable to the critical thickness, the layers 40 are pseudomorphic and adopt the same lattice constant as the GaP layer 41.

The back surface of P+ doped lower 45 and passivating layer 46 are roughened (textured) to create light trapping properties to more efficiently confine light in the tandem cell device 30. Similarly, the top surface of the device 30 comprising the AR coating layer 38 and N+ GaP layer 39 has been textured to create light-trapping properties. The combination of the P+ GaP layer 42 and the N+ Si layer 43 forms a tunnel junction for low resistance interconnection between cells 36 and 37.

Either or both of the tandem cells 10 or 30 can be fabricated monolithically in which case the GaP cell 12 or 36 is grown by, for example, vapor growth or liquid phase growth, upon the already fabricated Si cell 13 or 37. Alternately, Si cell 13 or 37 and GaP cell 12 or 36 can be fabricated and optimized separately, and joined by wafer bonding, or other means, where the P+ region of the GaP photovoltaic cell is wafer bonded to the N+ region of the silicon photovoltaic cell.

The foregoing description discloses only exemplary embodiments of the invention. Modifications of the above disclosed apparatus and methods which fall within the scope of the invention will be readily apparent to those of ordinary skill in the art. While this invention is described in terms of the above specific exemplary embodiment(s), those skilled in the art will recognize that the invention can be practiced with modifications within the spirit and scope of the appended claims, i.e. changes can be made in form and detail, without departing from the spirit and scope of the invention. Accordingly, while the present invention is disclosed in connection with exemplary embodiments thereof, it should be understood that changes can be made to provide other embodiments which may fall within the spirit and scope of the invention and all such changes come within the purview of the present invention and the invention encompasses the subject matter defined by the following claims.

What is claimed is:

1. A tandem photovoltaic cell device comprising:
    a bottom silicon cell comprising a lightly p-doped silicon layer formed on top of a P+ doped silicon region which has a back surface including a passivating dielectric layer composed of silicon dioxide or amorphous silicon;
    a tunnel junction comprising an N+ doped silicon layer formed on top of said lightly p-doped silicon region and a P+ silicon layer formed upon said N+ doped silicon layer;
    an upper (Gallium Phosphide) GaP photovoltaic cell comprising a a lightly P– doped GaP layer formed on top of said P+ doped silicon layer of said tunnel junction and an N+ doped top layer formed thereabove;
    at least one pseudomorphic, epitaxial, quantum well layer composed of a material other than GaP having a bandgap less than that of GaP formed between said lightly P-doped p-type GaP region and said N+ doped top layer; with said at least one quantum well layer having a lattice constant and thickness compatible with said lightly doped p-type GaP layer;
    said at least one quantum well layer comprising a depletion region formed between said N+ doped GaP layer and said lightly doped p-type GaP layer of said upper GaP photovoltaic cell;
    said upper GaP photovoltaic cell incorporating at least one layer of a semiconductor material for absorbing radiant energy within said depletion region of said N+ GaP junction;
    electrical means of contacting said upper GaP photovoltaic cell and said bottom silicon photovoltaic cell; and
    said at least one layer of material within said depletion region consists of at least one material selected from the group consisting of GaAs, GaAsP, GaInAs, GaInP, and GaInAsP.

2. The device of claim 1 in which said at least one of a plurality of layers within said depletion region of said GaP photovoltaic cell constitutes a quantum well region.

3. The device of claim 1 wherein:
    said back surface of said bottom silicon cell is covered with a passivating layer; and
    electrical contact is made to said first P+ region of said bottom silicon cell with conductive vias extending through said passivating layer.

4. The device of claim 1 wherein light trapping means are formed above said GaP photovoltaic cell and below said silicon photovoltaic cell.

5. A tandem photovoltaic cell device comprising:
    a P/P+, bottom silicon cell with a first p-type layer formed on top of a first P+ bottom layer which has a back surface including a passivating dielectric layer composed of silicon dioxide or amorphous silicon;
    an N+/P upper photovoltaic cell with a N+ doped GaP top layer and a second p-type doped GaP layer with at least one quantum well layer therebetween comprising a depletion region of said upper photovoltaic cell;
    a tunnel junction interconnection between said GaP photovoltaic cell and said silicon cell consisting of a second $P^+$ top region of said tunnel junction and an $N^+$ bottom region of said tunnel junction formed on to of said first p-type layer of said silicon cell;
    a passivating layer on a back side of said silicon cell in contact with said back surface of said first P+ bottom layer;
    electrical means of contacting said GaP photovoltaic cell and said silicon photovoltaic cell; and
    said quantum well region comprises materials selected from the group consisting of GaAs, GaAsP, GaInAs, GaInP, and GaInAsP.

6. The device of claim 5 wherein a plurality of layers within the depletion region of said GaP junction constitute said quantum well region.

7. The device of claim 6 wherein said materials constituting said quantum well region are pseudomorphic with GaP.

8. The device of claim 5 wherein light trapping means are formed on a top surface of said GaP photovoltaic cell and on a bottom surface of said silicon cell.

9. A two junction tandem photovoltaic cell device comprising:
    a P/P+ bottom silicon cell with first p-type region and a first P+ bottom region which has a back surface including a passivating dielectric layer;
    an N+/P upper GaP photovoltaic cell with a N+top region and a second p-type region with at least one quantum cell layer therebetween comprising a depletion region;
    a tunnel junction consisting of a second P+ region in contact with said second p-type region of said GaP photovoltaic cell and a second N+ in contact with said first p-type region of said P/P+ bottom silicon cell;
    said passivating dielectric layer being formed on a back surface of said silicon cell in contact with said back surface of said first P+ bottom region;
    light trapping means on at least one of a top surface of said GaP photovoltaic cell and a bottom surface of said silicon cell; and
    electrical means of contacting said GaP photovoltaic cell and said silicon photovoltaic cell; and
    said layers within said depletion region of said GaP photovoltaic cell comprise at least one material selected from the group consisting of GaAs, GaAsP, GaInAs, GaInP, and GaInAsP.

10. The device of claim 9 wherein said depletion region of said GaP photovoltaic cell comprises a quantum well.

11. The device of claim 9 wherein said layers within said depletion region of said GaP photovoltaic cell are pseudomorphic.

12. The device of claim 9 wherein:
   said depletion region of said GaP photovoltaic cell comprises a said quantum well comprising at least one material selected from the group consisting of GaAs, GaInAs, GaInP, and GaInAsP; and
   said at least one layer within said depletion region of said GaP photovoltaic cell is pseudomorphic.

13. The device of claim 9 wherein said electrical means of contacting said GaP photovoltaic cell and said silicon cell comprise an upper grid and a lower grid.

14. The device of claim 9 including a metal layer on a bottom surface of said passivation layer in contact with said electrical means of contacting.

15. The device of claim 9 wherein said light trapping means includes textured front and back surfaces.

16. The device of claim 15 wherein said light trapping means includes textured front and back surfaces.

17. The device of claim 9 in which said passivating layer on the back surface of said silicon cell consists of one of the group of silicon dioxide and amorphous silicon.

* * * * *